United States Patent [19]

Kling

[11] Patent Number: 4,821,005

[45] Date of Patent: Apr. 11, 1989

[54] ELECTRICAL CIRCUIT COMPONENT ASSEMBLY FOR CIRCUIT BOARDS

[75] Inventor: John P. Kling, Mt. Joy, Pa.

[73] Assignee: AMP Incorporated, Harrisburg, Pa.

[21] Appl. No.: 136,675

[22] Filed: Dec. 22, 1987

[51] Int. Cl.$^4$ .......................... H03H 7/01; H05K 1/18
[52] U.S. Cl. ..................................... 333/167; 333/12;
       333/181; 333/185; 361/400
[58] Field of Search ................... 333/12, 23, 185, 138,
       333/140, 167, 181, 184, 175, 177, 19, 20;
       361/400, 402, 405, 409, 417, 418; 336/192

[56] References Cited

U.S. PATENT DOCUMENTS

| | | | |
|---|---|---|---|
| 3,179,854 | 4/1965 | Leudicke et al. | 333/12 X |
| 3,593,217 | 7/1971 | Weber | 333/175 |
| 3,725,825 | 4/1973 | Hudson, Jr. | 333/182 |
| 3,939,444 | 2/1976 | Hollyday et al. | 333/182 |
| 3,991,347 | 11/1976 | Hollyday | 29/625 |
| 4,110,715 | 8/1978 | Reindel | 333/185 X |
| 4,490,706 | 12/1984 | Satou et al. | 336/192 X |
| 4,553,114 | 11/1985 | English et al. | 333/182 |

OTHER PUBLICATIONS

Sheffield—"Filter Design Simplified", Audio Engineering, Mar. 1951; pp. 13–14, and 34–36.

*Primary Examiner*—Marvin L. Nussbaum
*Attorney, Agent, or Firm*—Katherine A. Nelson

[57] ABSTRACT

Electrical circuit component assembly 28 of the present invention is comprised of three electrical circuit component members, 32, 40 and 41, respectively that are assembled such that first member 32 is in series and second and third members 40, 41 are in parallel with a signal, when assembly 28 is electrically connected between respective ends 64, 66 of discontinuous conductor 62 on circuit board 60. Electrical circuit component assembly 28 includes first member 32 having first and second electrically conductive portions 34, 38 at spaced locations along its body 36; second member 40 having first and second conductive areas 42, 46 at spaced locations on body member 44, and third member 41, having first and second conductive areas 43, 47 at spaced location thereon. First electrically conductive areas 42, 43 of respective members 40, 41 are for electrical connection to one of the conductive portions 34, 38 of first member 32 and to respective ends 64, 66 of a discontinuous circuit path 62 on the circuit board 60. Second electrically conductive areas 46, 47 of second and third members 40, 41 are for electrical connection to grounding means 68 on circuit board 60. Electrical circuit component assembly 28 further includes housing means 72. Electrical circuit component 28 provides a compact assembly that requires a minimum number of parts and can be surface mounted using a minimum amount of surface on a circuit board. Electrical circuit component 28 lends itself to be mounted to circuit boards by robotic devices and the like, which will enable circuit boards to be manufactured in a more cost effective manner.

18 Claims, 5 Drawing Sheets

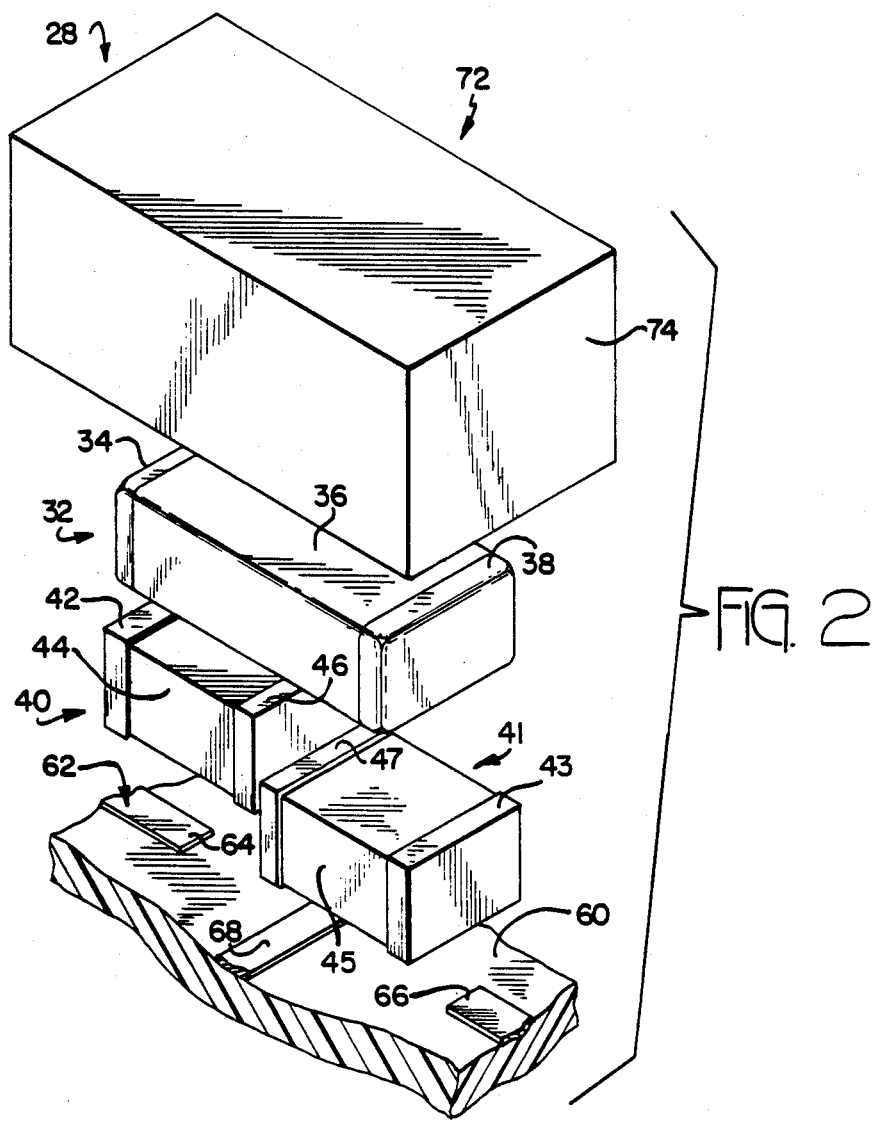

ELECTRICAL CIRCUIT COMPONENT ASSEMBLY FOR CIRCUIT BOARDS

FIELD OF THE INVENTION

The present invention relates to a device to provide effective EMI filtering or wave shaping of circuits on a circuit board and in particular to a device which can be readily attached by surface mounting to the circuit board.

BACKGROUND OF THE INVENTION

There is an increasing need to protect electronic equipment against radiated and conducted electromagnetic interference. While shielding is the main means for protecting against radiated EMI, some equipment requires extensive and complex filtered circuits combined with shielding to meet standards required by industry and/or various government agencies. There is a increasing need, therefore, for means to limit the frequency content of information signals to prevent radiation and thereby reduce the need for elaborate shielding. This basic concept is known as "wave shaping" and it is accomplished by filtering a signal such that the shape of the fundamental signal is noticeably altered. By slowing down the rise time, the high frequency content of a signal is greatly reduced, which results in less radiation. The wave shaping is achieved by providing capacitance, inductance, and/or resistance, or combinations thereof in series with the signal.

Currently, wave shaping capability is provided by mounting respective leaded components on a circuit board. Such devices occupy a relatively substantial amount of surface area on the board. It is desirable, therefore, to have a means for accomplishing wave shaping that is compact, leadless, and lend themselves to being installed by automatic equipment. It is to be understood that in the context of this specification, the term "wave shaping" includes "filtering".

Filters are employed in electronic equipment, such as computers, for filtering out radio frequency interference ("RFI") or electromagnetic interference ("EMI") thereby precluding spurious operation of the electronic equipment due to the external influences exerted by other mechanical or electrical equipment in the environment of the electronic equipment. For high impedance, high frequency circuits pi-network filters are generally used. The term pi-filter, as known in the art, generally refers to a low pass filter. A low pass pi-network filter is comprised of a shunt capacitor at both ends and an inductor in series between them. The pi-network configuration may also be used to construct a high pass filter, which comprises an inductor at both ends and a capacitor in series between them.

The elimination of high frequency noise is necessary for the transmission of signals through the input/output devices of microcomputers, for example. Both individual pi-network filters and composite pi-network filter assemblies have been used in connectors. Many of these devices are formed as ceramic tubular sleeves having conductive layers plated on the inner and outer surfaces thereof. In most instances these filters then have a pin terminal secured to the inner surface and the filter pin assembly is then secured by its outer surface in an aperture of an infinite ground plane.

U.S. Pat. Nos. 4,553,114, 3,939,444, and 3,991,347 describe leaded devices that provide filtering on circuit boards. These devices generally are comprised of a filter sleeve mounted on a conductor, such that the ends of the conductor can be inserted into through holes of a circuit board, and a means for grounding the ground conductor on the filter sleeve. In the -347 patent, grounding is provided by directly soldering the sleeve to a ground conductor on the board. In the -114 and -444 patents, grounding is provided by a separate conductor member, thus requiring a third through hole in the circuit board for each filter device. While these devices serve to accomplish the desired filtering, they require the use of a relatively substantial amount of surface on the circuit board.

In addition the devices described and claimed in the aforesaid patents do not readily lend themselves to being installed by automatic equipment, such as robotic devices.

SUMMARY OF THE INVENTION

Accordingly, it is an object of the present invention to provide an individual electrical circuit component assembly requiring a minimum number of parts.

It is a further object of the invention to provide an individual electrical circuit component assembly which can be mechanically secured and electrically connected to a circuit board with a minimum of fabrication steps.

Accordingly, it is a further object of the present invention to provide an individual pi-network filter assembly requiring a minimum number of parts.

It is a still further object of the invention to provide an individual pi-network filter assembly which can be mechanically secured and electrically connected to a circuit board with a minimum of fabrication steps.

In addition, it is an object of the present invention to provide a high performance pi-network filter assembly.

It is also an object of the invention to provide an electrical circuit component assembly comprising members having various combinations of selected electrical properties.

It is yet another object of the present invention to provide an electrical circuit component assembly, suitable for use on printed circuit boards, which is substantially more compact than the component assemblies heretofore resorted to in the prior art, thereby providing the circuit designer with added flexibility, facilitating equipment miniaturization, and providing a cost effective means of filtering and/or providing wave shaping capabilities for circuits in electronic equipment.

It is also an object of the present invention to provide an improved electrical circuit component assembly which readily facilitates the automated production, assembly, and use thereof, thereby substantially reducing overall manufacturing costs.

In accordance with the teachings of the present invention, a preferred embodiment thereof is herein illustrated and described, comprising an electrical circuit component assembly having wave shaping capabilities or for providing RFI/EMI filtering on a printed circuit board.

The electrical circuit component assembly of the present invention is comprised of three electrical circuit component members that are assembled such that one member is in series and two members are in parallel with a signal, when the assembly is electrically connected between respective ends of a discontinuous conductor on a circuit board.

The electrical circuit component assembly includes a first member having first and second electrically conductive portions at spaced locations along its body; and second and third members, each having first and second conductive areas at spaced location thereon. The above members are generally box shaped, each member comprising a dielectric body having conductive material disposed at opposed ends thereof. Such members are commercially available and are known in the art as "chip components". The electrical characteristics of the members can be varied by changing the size and/or composition of the body and the location of the conductive portions or areas.

In the assembled unit, the first member is positioned above the second and third members with the first conductive areas of the second and third members electrically interconnected to corresponding first and second conductive portions of the first member. When the unit is mounted to a circuit board the first conductive areas are electrically interconnected to respective ends of a discontinuous circuit path to provide wave shaping or filtering for the signal carried on the path. The second conductive areas of the second and third members are connected to grounding means on the circuit board. The preferred embodiment further includes a dielectric housing means having a cavity therein for receiving the assembled component subassembly. To facilitate handling of the assemblies in automated assembly equipment the cavity of the housing means is preferably sized to accept a variety of different sized subassemblies. The housing means provides protection for the component subassembly and in addition provides a standardized unit for robotic assembly equipment. The present invention thus provides a standardized component package that permits flexibility in selecting the electrical characteristics of the assembly. The component assembly can, therefore, be designed as a low pass or high pass filter system or provide wave shaping capabilities to selected circuits on the board.

For purposes of illustration, the invention will be described in terms of a filter assembly, and more particularly a pi-network filter assembly. It is to be understood that the electrical circuit component assemblies of the present invention are made in essentially the same manner as the filter assemblies, but with different chip component members. The filter assembly of the present invention includes an inductive member having first and second electrically conductive portions at spaced locations along its body; and two capacitive members, each having first and second conductive areas at spaced location thereon.

In the assembled filter unit, the inductive member is positioned above the two capacitive members with the first conductive areas of respective capacitive members electrically interconnected to corresponding first and second conductive portions of the inductive member. When the unit is mounted to a circuit board the first conductive areas are electrically interconnected to respective ends of a discontinuous circuit path to provide filtering for the signal carried on the path. The second conductive areas of the capacitive members are connected to grounding means on the circuit board. The preferred embodiment further includes a dielectric housing means having a cavity therein for receiving the assembled filter subassembly. To facilitate handling of the filter assemblies in automated assembly equipment the cavity of the housing means is preferably sized to accept a variety of different sized filter units. The housing means provides protection for the filter subassembly and in addition provides a standardized unit for robotic assembly equipment. The present invention thus provides a standardized filter package that permits flexibility in selecting the electrical characteristics of the assembly.

The invention is further directed to a cascaded pi-network filter assembly, wherein two or more of the filter units are electrically connected in series to provide greater filtering capability. Preferably the cascaded filter unit is disposed in a dielectric housing.

The invention is still further directed to a high pass filter assembly wherein capacitive and inductive elements are interchanged in the pi configuration.

Some of the objects and advantages of the invention having been stated, others will appear as the description proceeds when taken in conjunction with the accompanying drawings.

BRIEF DESCRIPTION OF THE DRAWINGS

FIG. 1 is a perspective view of a prior art filter assembly for a circuit board.

FIGS. 2 and 2A are exploded perspective views of an filter assembly for mounting to a circuit board in accordance with the present invention.

DETAILED DESCRIPTION OF THE DRAWINGS

Figures 1, 2A:
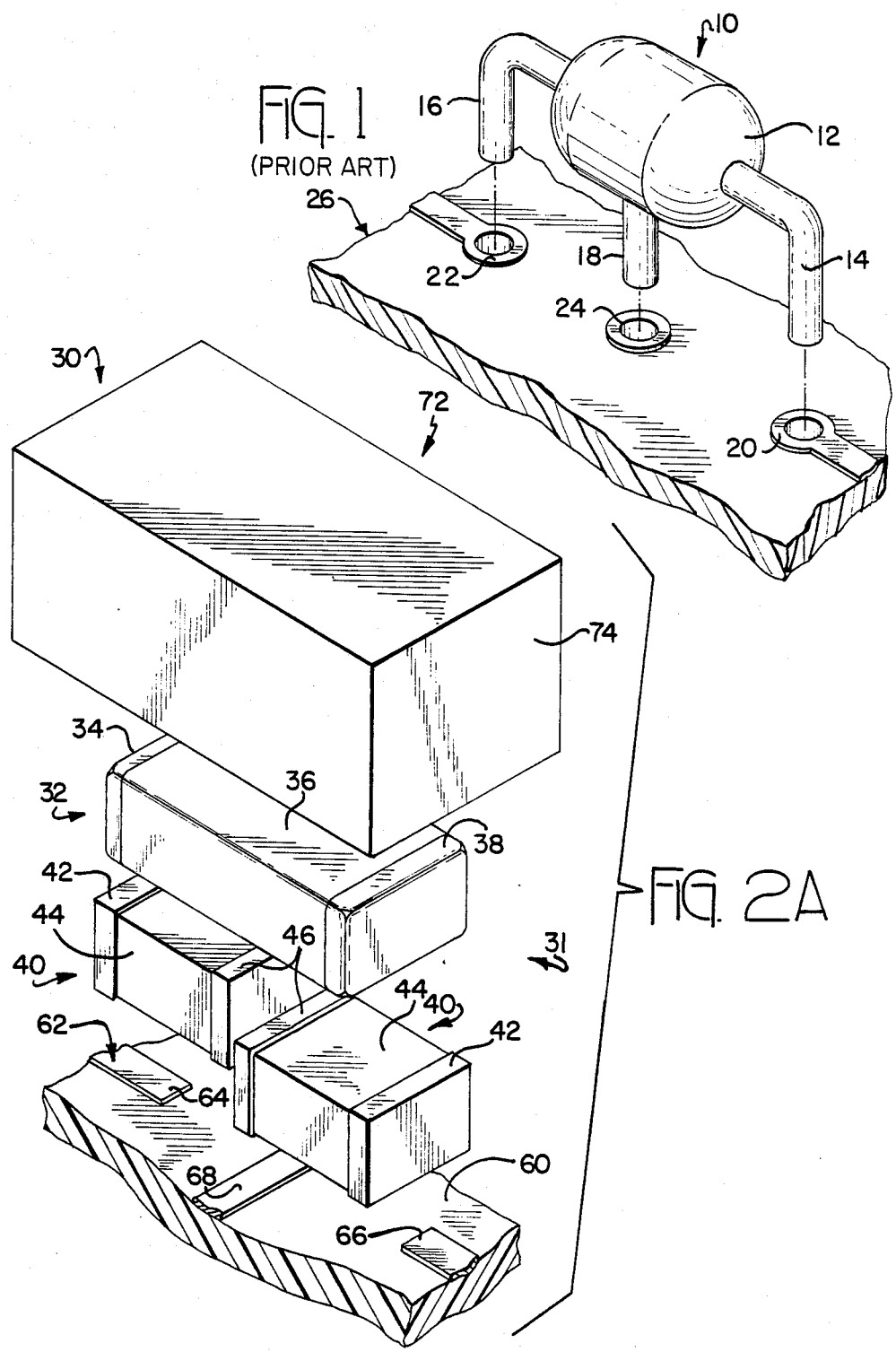

FIG. 1 shows a prior art encapsulated filter assembly 10 for mounting to a circuit board 26. Filter assembly 10 is comprised of an encapsulated body portion 12 having terminal legs 14, 16 and ground leg 18 extending therefrom. Body 12 is encapsulated about a filter sleeve mounted to a pin terminal and an eyelet portion of the ground terminal formed about the filter sleeve. Terminal legs 14, 16 are formed at right angles to the filter sleeve for insertion into circuit board 26 and for electrical connection to conductor portions 20 and 22 respectively, with ground pin 18 being inserted into through hole 24 for electrical engagement with ground conductor. The encapsulated filter device of FIG. 1 is disclosed in U.S. Pat. No. 4,553,114.

FIG. 2 shows electrical circuit component assembly 28 of the present invention comprised of three electrical circuit component members, 32, 40 and 41, respectively that are assembled such that first member 32 is in series and second and third members 40, 41 are in parallel with a signal, when assembly 28 is electrically connected between respective ends 64, 66 of discontinuous conductor 62 on circuit board 60.

. Electrical circuit component assembly 28 includes first member 32 having first and second electrically conductive portions 34, 38 at spaced locations along its body 36; second member 40 having first and second conductive areas 42, 46 at spaced locations on body member 44, and third member 41, having first and second conductive areas 43, 47 at spaced locations on body member 45. The above members are generally box shaped, each member comprising a dielectric body having conductive material disposed at opposed ends thereof. First electrically conductive areas 42, 43 of respective members 40, 41 are for electrical connection to one of the conductive portions 34, 38 of first member 32 and to respective ends 64, 66 of a discontinuous circuit path 62 on the circuit board 60. Second electrically conductive areas 46, 45 of second and third members 40, 41 are for electrical connection to grounding means 68 on circuit board 60, as best seen in FIGS. 2.

For purposes of illustration, the invention will be described in terms of a filter assembly, and more particularly a pi-network filter assembly. It is to be understood that the electrical circuit component assemblies of the present invention are made in essentially the same manner as the filter assemblies, but with different chip component members.

Figure 3:
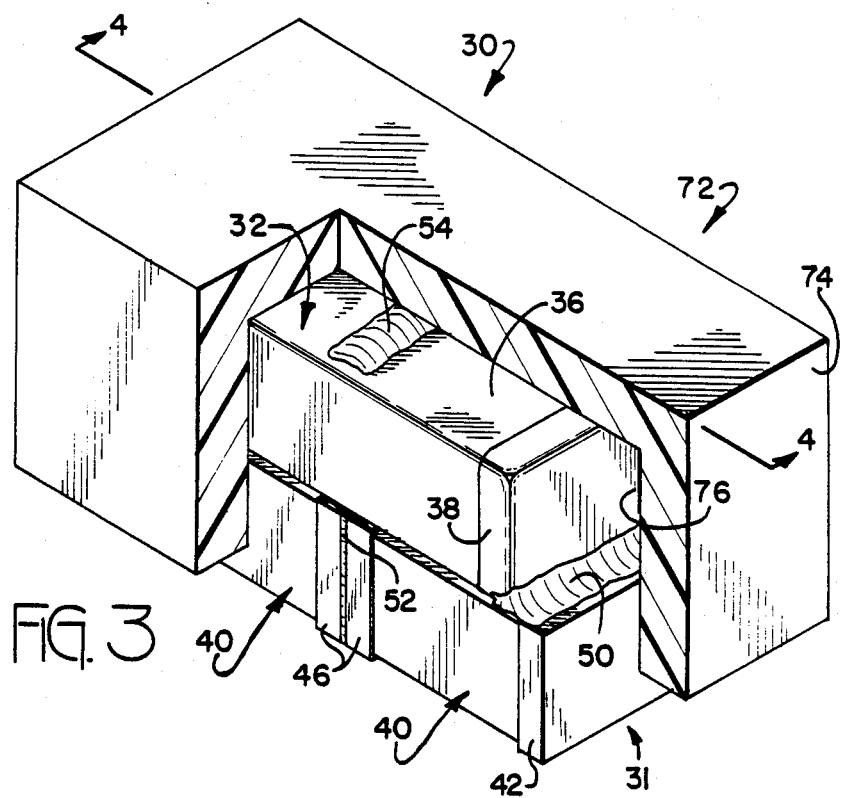
FIG. 3 is a perspective view of the assembled filter assembly of FIG. 2 with a portion of the housing cut away.
Figure 4:
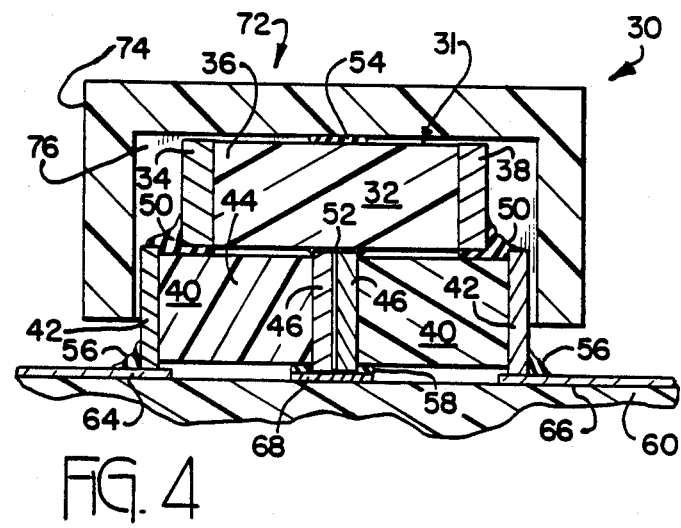
FIG. 4 is a cross-sectional view of the filter assembly taken along line 4—4 of FIG. 3.

As shown in FIGS. 2A, 3, and 4, filter assembly 30 in accordance with the present invention is surface mounted to circuit board 60. In its preferred embodiment assembly 30 is a pi-network filter comprised of a first component member 32, and two second component members 40, first member 32 having first and second electrically conductive portions or pads 34 and 38 at spaced locations along body member 36, and each second member 40 having first and second conductive areas 42, 46 spaced from each other on body member 44. In the preferred embodiment, first member 32 is an inductor and second members 40 are capacitors. First electrically conductive areas 42 of respective capacitive members 40 are for electrical connection to one of the conductive portions 34, 38 of inductive member 32 and to respective ends 64, 66 of a discontinuous circuit path 62 on the circuit board 60. Second electrically conductive areas 46 of capacitive members 40 are for electrical connection to grounding means 68 on circuit board 60, as best seen in FIGS. 2 and 4. The schematic drawing for the low pass filter assembly described above is illustrated in FIG. 6A.

In the preferred embodiment capacitive members 40 are assembled in side-by-side relationship such that first conductive areas 42 are at opposed ends and second conductive areas 46 are adjacent each other. A conductive adhesive may be used to secure capacitive members together and to ensure electrical engagement between second conductive areas 46. Inductive member 32 is positioned over the two capacitive members 40 such that first and second conductive portions 34, 38 of inductive member 32 overlie respective first conductive areas 42 of corresponding capacitive members 40.

Electrical connection means 50 is disposed between conductive portions 34, 38 and the corresponding first conductive areas 42 to interconnect the inductor and capacitive members. Preferably the electrical connection means is conductive adhesive or solder which mechanically secures and electrically interconnects the corresponding conductors. In addition a dielectric adhesive or other insulating material may be used at 52 to provide insulation between second conductive areas 46 and the undersurface of inductor body 32.

Filter subassembly 31, comprised of inductive and capacitive members 32, 40, may be mounted directly to circuit board 60 or preferably be inserted into dielectric housing means 72 having cavity 76 therein. Housing means 72 is preferably made of a high temperature dielectric material that is suitable for surface mount techniques and temperatures associated with vapor phase and wave soldering procedures.

To facilitate handling of the filter assemblies in automated assembly equipment, cavity 76 of housing means 72 is preferably dimensioned to receive a variety of different sized filter subassemblies 31. Preferably housing means 72 is secured to the top surface of inductive member 32 by adhesive means at 54. Housing means 72 provides protection for filter subassembly 31 and in addition provides a standardized unit for robotic assembly equipment.

As shown in FIG. 4 filter assembly unit 30 is mounted to circuit board 60 by disposing conductive means 56 and 58 to electrically interconnect and mechanically secure first conductive areas 42 of capacitive members 40 to respective ends 64, 66 of conductors 62 and second conductive areas 46 of capacitive members 40 to ground means 68. In the embodiment shown in FIGS. 2 and 4 ground conductor 68 of circuit board 60 is on its upper surface, thus permitting all interconnections to be made in accordance with surface mount techniques. Alternatively, interconnection to a ground conductor on the under surface may be achieved by the use of a plated through hole (not shown). Preferably solder or conductive adhesive is used to join filter assembly 30 to circuit conductor 62 and ground conductor 68 on circuit board 60.

As can be seen in FIGS. 3 and 4 side walls 74 of housing means 72 extend partially down the sides of the filter subassembly 31. Side walls 74 preferably end above the surface of the circuit board to allow the conductive means 56 to be applied between first conductive areas 42 and conductor ends 64, 66 and, if solder is used as the interconnecting means, to allow for cleaning procedures associated with the soldering process. To prevent cleaning solvents, solder and fluxes from entering subassembly 31, it may be encased with a dielectric material, such as an epoxy adhesive to seal the openings between the housing means and subassembly 31.

Figure 6B:
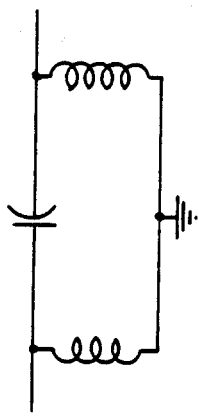
FIGS. 6A-6C are schematic drawings of the filter assemblies of FIGS. 2 and 5.
Figure 6A:
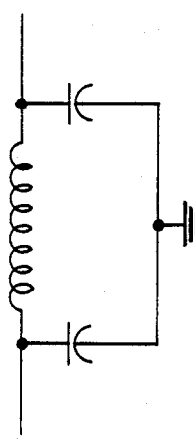

The construction of the preferred embodiment of the invention disclosed herein includes a pair of capacitive chips and an inductive chip, thus producing a low pass pi-network filter. A high pass pi-network filter assembly can be assembled in a similar manner by using a chip capacitor as the first member and a pair of inductor chips as the second members. The schematic drawing illustrating the high pass filter assembly is shown in FIG. 6B. The filtering capabilities of the above filter assemblies can be altered by selecting the desired reactance properties of the inductor and capacitor members. It is to be understood that the value of the capacitors can be varied by varying the type of dielectric materials employed and the number of inner plates. Furthermore, with respect to the inductance it should be understood that the amount of inductance can also be varied by the composition of the material used in the chip inductor and by varying the size, length, and configuration of the member. The length of the inductive member is preferably slightly less than or slightly greater than the lengths of the two adjacent capacitive members to allow for deposition of the conductive means 50. It is to be understood that other filter assemblies comprising members having various combinations of selected electrical properties may also be made in accordance with the invention. The present invention also permits filters having different capacitances or other electrical characteristics to be used at different locations on the circuit board.

Figure 5:
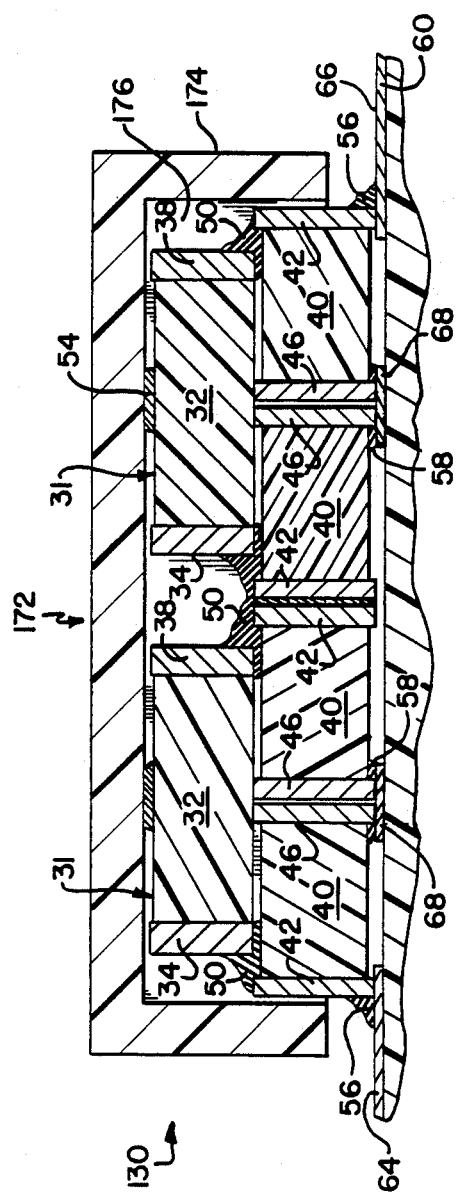
FIG. 5 is a cross-sectional view of a cascaded filter assembly made in accordance with the present invention.
Figure 6C:
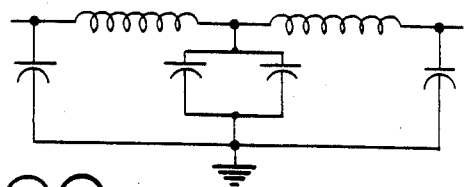

FIG. 5 illustrates a cascaded pi-network filter assembly 130 comprised of two filter subassemblies 31 joined in series by interconnecting respective first conductive areas 42 of each subassembly to each other at 78 and the other first conductive area 42 of each of subassemblies 31 to respective ends of a discontinuous conductor on a circuit board in the same manner as previously described. Grounding for cascaded assembly 130 is provided by interconnecting each of the joined second conductive areas 46 to respective through holes 70 with conductive means 58. The schematic drawing for the cascaded pi-network assembly is illustrated in FIG. 6C.

Figure 7A:
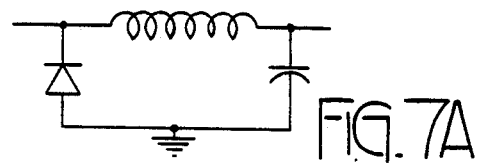
FIGS. 7A-7D are schematic drawings of alternative embodiments of electrical circuit component assemblies made in accordance with this invention.
Figure 7B:
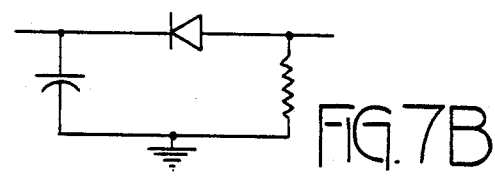
Figure 7C:
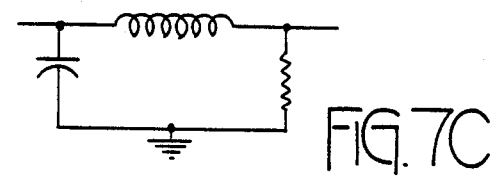
Figure 7D:
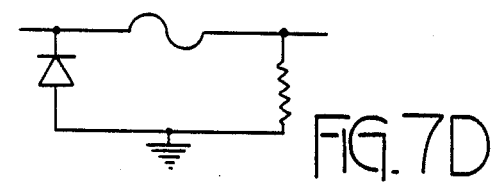

FIGS. 7A-7D are schematic drawings of alternative embodiments of electrical circuit component assemblies made in accordance with this invention. The components described in these figures have various wave shaping capabilities, as known in the art. In FIG. 7A the first member is an inductor and the second and third members are a diode and capacitor. In FIG. 7B the first member is a diode and the second and third members are a capacitor and resistor respectively. The first member in FIG. 7C is an inductor, while the second and third members are a capacitor and resistor, respectively. FIG. 7D shows a fuse as the first member with a diode and resistor as the other members of the assembly. The electrical circuit component assemblies are made in essentially the same manner as the filter assemblies described above, except that different chip components are used for the three members of the assembly. The electric components described in these figures may be assembled in cascaded form as well.

The electrical circuit components used in the assemblies of the present invention are known as "chip components". Typical inductor chips are about 0.075×0.150×0.130 inches. Typical capacitor chips are about half that size. A filter assembly made in accordance with the invention and using inductive and capacitive components of the above dimensions occupies less than one third the surface area of a board as the leaded device of FIG. 1. Thus, a number of the filter assemblies can be placed in relatively small area of the circuit board. Chip resistors, diodes and fuses are of compatible size to the aforesaid components. The present invention provides a means for filtering circuit board conductors in a convenient, cost effective and space saving manner.

The present invention teaches a compact electrical circuit component assembly 30 that facilitates the miniaturization of circuit boards used extensively in electronic equipment. Accordingly, it will be appreciated by those skilled in the art that the improved electrical circuit component assembly of the present invention provides compactness and miniaturization while facilitating cost effective production and automated assembly methods.

Obviously many modifications can be made without departing from the basic spirit of the invention.

In the drawings and specifications, there have been set forth preferred embodiments in the invention and although specific terms are employed, they are used in generic and descriptive sense only, and not for purposes of limitation.

What is claimed is:

1. An electrical circuit component assembly for mounting to circuit boards comprising:
   a first member having a first selected electrical circuit-modifying capability, said first member having first and second electrically conductive portion, at spaced locations therealong;
   a second member having a second selected electrical circuit-modifying capability, said second member being proximate said first member, said second member having a first electrically conductive area exposed for electrical connection to one of said first member conductive portions and for electrical connection to one end of a discontinuous conductor on a circuit board and a second electrically conductive area spaced from said first area and exposed for electrical connection to a grounding means of the circuit board;
   a third member having a third selected electrical circuit-modifying capability, said third member being proximate said first member, said third member having a first electrically conductive area exposed for electrical connection to the other of said first member conductive portions and for electrical connection to the other end of said discontinuous conductor on said circuit board and a second electrically conductive area spaced from said first area and exposed for electrical connection to a grounding means of the circuit board; and
   said first member being secured to said second and third members, electrical connection means disposed at said first and second conductive portions of said first member electrically connecting respective portions with corresponding first conductive areas of said second and third members defining an assembly mountable to a circuit board with said second and third members adjacent thereto with said first conductive areas of said second and third members and their respective interconnected conductive portions electrically interconnectable with respective ends of said discontinuous conductor on said circuit board and said second conductive areas of said second and third members electrically connectable to said grounding means, whereby said first, second and third member circuit-modifying capabilities are selectable so that said defined assembly upon mounting completes the circuit path of said conductor w! . means for providing harmonic attenuation of a signal carried along said conductor.

2. The electrical circuit assembly as described in claim 1 further including dielectric means housing said assembly and exposing board proximate surfaces of said second and third members.

3. The electrical circuit component assembly as described in claim 1 wherein said first selected electrical circuit-modifying capability is different from said second and third selected electrical circuit-modifying capabilities.

4. The electrical circuit component assembly as described in claim 1 wherein said first, second and third selected electrical circuit-modifying capabilities of the three members are different from each other.

5. The electrical circuit component assembly as described in claim 1 wherein said second and third members have the same selected electrical circuit-modifying capabilities.

6. The electrical circuit component assembly as described in claim 5 wherein said component assembly is a filter assembly and wherein the first member is an inductor and the second and third members are capacitors.

7. The electrical circuit component assembly as described in claim 5 wherein said component assembly is a filter assembly and wherein the first member is a capacitor and the second and third members are inductors.

8. An electrical circuit component assembly for mounting to circuit boards comprising:
   at least one first member having a first selected electrical circuit-modifying capability, said at least one first member having first and second electrically conductive portions at spaced locations therealong;
   at least one second member having a second selected electrical circuit-modifying capability, said at least one second member being proximate said at least one first member, said at least one second member having a first electrically conductive area exposed for electrical connection to one of said at least one first member conductive portions and for electrical connection to one of a discontinuous conductor on a circuit board and a second electrically conductive area spaced from said first area and exposed for electrical connection to a surrounding means of the circuit board;
   at least one third member having a third selected electrical circuit-modifying capability, said at least one third member being proximate said at least one first member, said at least one third member having a first electrically conductive area exposed for electrical connection to the other of said at least one first member conductive portions and for electrical connection to the other end of said discontinuous conductor on said circuit board and a second electrically conductive area spaced from said first area and exposed for electrical connection to a grounding means of the circuit board; and
   said at least one first member being secured to one of said at least one second and to one of said at least one third members, electrical connection mean disposed at said first and second conductive portions of said at least one first member electrically connecting respective portions with one of said first conductive areas of said at least one second and third members defining an assembly mountable to a circuit board with each said second and third members adjacent thereto with said first conductive areas of said second and third members and their respective interconnected conductive portions electrically interconnectable with respective ends of said discontinuous conductor on said circuit board and said second conductive areas of said second and third members electrically connectable to said grounding means, whereby said first, second and third member circuit-modifying capabilities are selectable so that said defined assembly upon mounting completes the circuit path of said conductor with means for providing harmonic attenuation of a signal carried along said conductor.

9. The electrical circuit component assembly as described in claim 8 further including means housing said assembly and exposing said board proximate surfaces of said at least one second and third members.

10. The electrical circuit component assembly as described in claim 8 wherein the at least one first member is an inductor and the at least one second and third members are capacitors.

11. The electrical circuit component assembly as described in claim 8 wherein the at least one first member is a capacitor and the at least one second and third members are inductors.

12. A filter assembly for mounting to circuit boards comprising:
   a first member having first selected reactance properties, said first member having first and second electrically conductive portions at spaced locations therealong;
   two second members having second selected reactance properties, said second members being proximate said first member, each of said second members having a first electrically conductive area for electrical connection to one of said first member conductive portions and to respective ends of a discontinuous conductor on a circuit board and a second electrically conductive area spaced from said first area for electrical connection to grounding means; and
   electrical connection means disposed at said first and second conductive portions of said first member electrically connecting respective portions with one of said first conductive areas of said second members defining an assembly mountable to a circuit board with said second members adjacent thereto with said first conductive areas and their respective interconnected conductive portions electrically interconnectable with respective ends of said discontinuous conductor on said circuit board and said second conductive areas electrically connectable to said grounding means, whereby said first and second member reactance properties are selectable so that said defined assembly upon mounting completes the circuit path of said conductor with means providing filtering for a signal carried along said conductor.

13. The filter assembly as described in claim 12 wherein said first selected reactance properties are different from said second selected reactance properties.

14. The filter assembly as described in claim 12 further including housing means.

15. The filter assembly as described in claim 12 wherein the first member is an inductor and the second members are capacitors.

16. The filter assembly as described in claim 12 wherein the first member is a capacitor and the second members are inductors.

17. A method for making an electrical circuit component assembly for mounting to circuit boards comprising the steps of:
   selecting a first member having a first selected electrical circuit-modifying property, said first member having first and second electrically conductive portions at spaced locations therealong;
   selecting a second member having a second selected electrical circuit-modifying property, said second member having a first electrically conductive area exposed for electrical connection to one of said first member conductive portions and for electrical connection to one end of a discontinuous conductor on a circuit board and a second electrically conductive area spaced from said first area and exposed for electrical connection to a grounding means of the circuit board;
   selecting a third member having a third selected electrical circuit-modifying property, said third member having a first electrically conductive area exposed for electrical connection to the other of said first member conductive portions and for electrical connection to the other end of said discontinuous conductor on said circuit board and a second electrically conductive area spaced from said first area and exposed for electrical connection to a grounding means of the circuit board;

placing said first member proximate said second and third members in such a manner that corresponding conductive portions and areas are proximate each other, and securing said first member to said second and third members such that electrical connection means disposed at said first and second conductive portions of said first member electrically connects respective portions thereof with corresponding ones of said first conductive areas of said second and third members defining an assembly mountable to a circuit board with said second and third members adjacent thereto with said first conductive areas and their respective interconnected conductive portions electrically interconnectable to respective ends of said discontinuous conductor on said circuit board and said second conductive areas electrically connectable to said grounding means;

said first, second and third members being selected so that upon mounting said defined assembly to said circuit board completing the circuit path of the conductor the defined assembly comprises a means for providing harmonic attenuation of a signal carried along said conductor.

18. The method for making an electrical circuit component assembly as described in claim 17 further including the step of providing a housing means for said assembly such that the board proximate surfaces of the second and third members are exposed.

* * * * *